US008924183B2

(12) United States Patent
Zona et al.

(10) Patent No.: US 8,924,183 B2
(45) Date of Patent: Dec. 30, 2014

(54) SYSTEMS AND METHODS FOR PREDICTING THE USEABLE LIFE OF A PHOTORECEPTOR IN IMAGING DEVICES

(75) Inventors: Michael F. Zona, Holley, NY (US); Aaron Michael Burry, Ontario, NY (US); Peter Paul, Webster, NY (US); Eric S. Hamby, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 670 days.

(21) Appl. No.: 12/783,203

(22) Filed: May 19, 2010

(65) Prior Publication Data

US 2011/0288821 A1 Nov. 24, 2011

(51) Int. Cl.

| | |
|---|---|
| ***G21C 17/00*** | (2006.01) |
| ***G06F 19/00*** | (2011.01) |
| ***G01R 19/165*** | (2006.01) |
| ***G03G 15/00*** | (2006.01) |

(52) U.S. Cl.

CPC .......... *G03G 15/553* (2013.01); *G03G 15/5037* (2013.01)

USPC ................ 702/182; 702/183; 702/64; 399/26

(58) Field of Classification Search

USPC ................... 702/64, 182–185; 399/26, 44, 50

See application file for complete search history.

(56) References Cited

U.S. PATENT DOCUMENTS

| | | | | |
|---|---|---|---|---|
| 5,703,487 A * | 12/1997 | Mishra | .......................... | 324/456 |
| 6,008,653 A * | 12/1999 | Popovic et al. | ............... | 324/456 |
| 7,949,268 B2 * | 5/2011 | Burry et al. | ..................... | 399/44 |
| 2007/0279653 A1 * | 12/2007 | Bonikowski | ................... | 358/1.9 |
| 2008/0152371 A1 * | 6/2008 | Burry et al. | ..................... | 399/50 |

FOREIGN PATENT DOCUMENTS

JP 02004101837 A * 4/2004 ............. G03G 21/00

* cited by examiner

*Primary Examiner* — Michael Nghiem

*Assistant Examiner* — Alexander Satanovsky

(74) *Attorney, Agent, or Firm* — MH2 Technology Law Group LLP

(57) ABSTRACT

Systems and methods of determining a predicted usable life of components, such as a photoreceptor, associated with an imaging device. The systems and methods include a power source configured to increase an electric field across the photoreceptor. A sensor or array is configured to detect charge deficient spots (CDS) in a charge transport layer (CTL) of the photoreceptor as a result of increasing the electric field. The systems and methods are configured to determine the predicted useable life of the photoreceptor based on the detected CDS. The systems and methods are further configured to output a report of the estimation. The estimation is conducted at fixed or variable intervals throughout the life of the photoreceptor and/or imaging device.

16 Claims, 7 Drawing Sheets

SYSTEMS AND METHODS FOR PREDICTING THE USEABLE LIFE OF A PHOTORECEPTOR IN IMAGING DEVICES

FIELD OF THE INVENTION

This invention relates to the field of printing and imaging devices, and more particularly to systems and methods for predicting the useable life of printing and imaging devices.

BACKGROUND OF THE INVENTION

Xerographic or electrophotographic image forming methods and systems are used in marking devices such as copiers, scanners, fax machines, laser printers, multifunction devices, and the like. One component of the xerographic process is a photoreceptor, which is made from materials having a surface that can be negatively or positively charged. The photoreceptor can be exposed to a light pattern of an original image or a substrate to selectively discharge the surface in accordance therewith. The resulting pattern of charged and discharged areas on the photoreceptor can form an electrostatic charge pattern, known as a latent image that corresponds to the original image. The latent image can be developed on a substrate by contacting the latent image with toner The photoreceptor can have a charge transport layer (CTL) that can carry the charge that determines toner placement on a substrate to be copied or printed. Over the lifecycle of the marking device and corresponding photoreceptor, the CTL can deplete and reduce in thickness, which can cause the photoreceptor to be more susceptible to field breakdown within the CTL, which can lead to spot defects known as charge depleted spots (CDS). If a marking device has CDS defects, the substrate outputs produced by the marking device can have noticeable spots that reduce the accuracy and quality of the prints. To prevent the occurrence of CDS defects in customer prints, a counter with a programmed hard-stop point can be used to trigger the end of life for the photoreceptor. The programmed hard-stop point of the photoreceptor can be estimated, for example, through design testing of a set of photoreceptors.

Because the wear rate of the CTL, and therefore the usable life, of the photoreceptor is affected by a number of customer usage factors, such as, for example, area coverage, environmental conditions, developer age, and job length, marking devices make use of the estimated life limit and a thickness of the CTL to estimate the remaining useful life of the photoreceptor. However, these estimation techniques are based on average wear of an average CTL, and are therefore not entirely accurate. As a result, the photoreceptor may fail, and CDS defects may occur, before the estimated life limit is reached. Further, the photoreceptor may have remaining workable cycles when the estimated life limit is reached.

A need, therefore, exists for systems and methods that allow for a more accurate photoreceptor life limit measurement. Further, a need exists for systems and methods for reducing costs associated with inaccurate estimated life limits.

SUMMARY OF THE EMBODIMENTS

The following presents a simplified summary in order to provide a basic understanding of some aspects of one or more embodiments of the invention. This summary is not an extensive overview, nor is it intended to identify key or critical elements of the invention nor to delineate the scope of the invention. Rather, its primary purpose is merely to present one or more concepts in simplified form as a prelude to the detailed description presented later.

In accordance with the present teachings, a method of determining a predicted useable life of a photoreceptor of a device is provided. The method comprises increasing an electric field across the photoreceptor and detecting charge deficient spots (CDS) in a charge transport layer (CTL) of the photoreceptor as a result of increasing the electric field. Further the method comprises determining the predicted useable life of the photoreceptor based on the detected CDS.

In accordance with the present teachings, a system for determining a predicted useable life of a photoreceptor of a device is provided. The system comprises a power source configured to increase an electric field across the photoreceptor and a scanner configured to detect charge deficient spots (CDS) in a charge transport layer (CTL) of the photoreceptor as a result of increasing the electric field. The system further comprises a processor configured to determine the predicted useable life of the photoreceptor based on the detected CDS.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

Figure 1A:
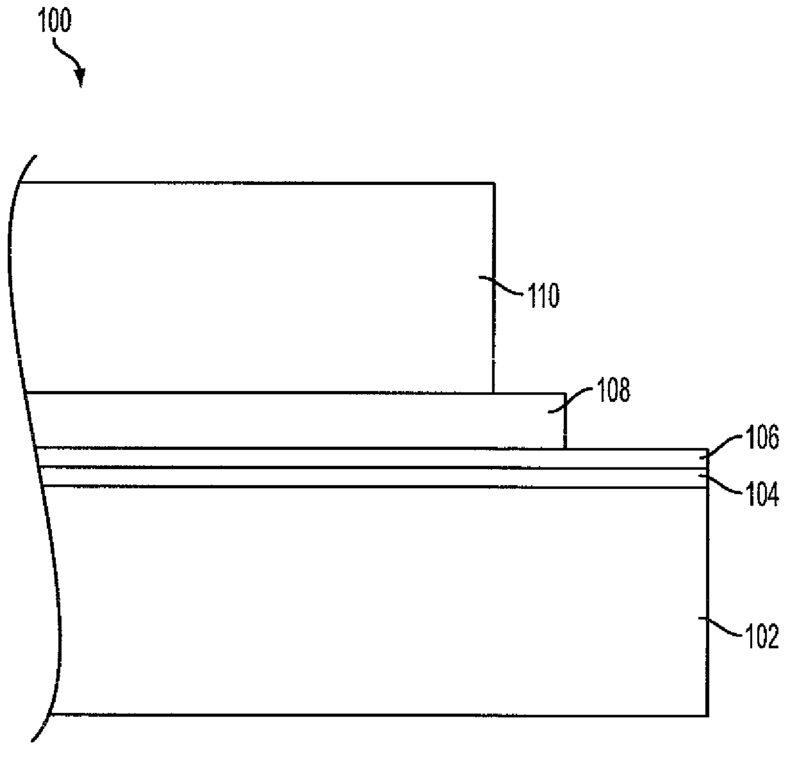
FIG. 1A depicts a cross-section of an imaging member of an exemplary imaging device according to the present teachings.

It should be noted that some details of the drawings have been simplified and are drawn to facilitate understanding of the inventive embodiments rather than to maintain strict structural accuracy, detail, and scale.

DESCRIPTION OF THE EMBODIMENTS

For simplicity and illustrative purposes, the principles of the present teachings are described by referring mainly to exemplary embodiments thereof. However, one of ordinary skill in the art would readily recognize that the same principles are equally applicable to, and can be implemented in, all types of information and systems, and that any such variations do not depart from the true spirit and scope of the present teachings. Moreover, in the following detailed description, references are made to the accompanying figures, which illustrate specific exemplary embodiments. Electrical, mechanical, logical and structural changes may be made to the exemplary embodiments without departing from the spirit and scope of the present teachings. The following detailed description is, therefore, not to be taken in a limiting sense and the scope of the present teachings is defined by the appended claims and their equivalents.

Various embodiments provide systems and methods for determining the predicting useable life of a photoreceptor in a xerographic imaging or marking engine or device. It should be appreciated that various imaging devices can be used in the present embodiments. For example, the imaging device can be a multi-function imaging device comprising a scanner, printer, copier, fax, and/or other features used in imaging operations. In embodiments, the imaging device can incorporate one or more photoreceptors to allow for xerographic or electrophotographic marking technology. It should be appreciated that other similar imaging devices can be used in the present embodiments, of which the components can be combined or standalone entities.

The systems and methods described herein can directly measure the occurrence of a life-limiting defect for photoreceptors of imaging devices. In particular, the systems and methods can measure the occurrence of charge depleted spots (CDS) defects in a charge transport layer (CTL) of a photoreceptor. By increasing the electric field between the CTL and a ground plane of the photoreceptor, the occurrence of the CDS defects can be enhanced, thereby making the CDS defects easier to measure. The measurements can be used to determine, calculate, or estimate a point in time at which the onset of the CDS defects will occur under normal operating conditions of the imaging device and/or photoreceptor. Further, the measurement technique can also provide spatial information about defect susceptibility, which can be relevant information because the wear and CDS defects of the photoreceptor can be non-uniform.

By determining the predicted point in time at which the onset of the CDS defects may occur, and thus when the photoreceptor may fail, the photoreceptor can be run close to its failure point and the total system run cost can be reduced. For instance, by accurately determining the predicted failure point, the photoreceptor can be run nearly to its failure point instead of to a programmed failure point. As such, cases in which the programmed failure point signals replacement of a working photoreceptor that could generate more images can be reduced. Further, cases in which CDS defects occur due to the CTL wearing faster than anticipated by the programmed failure point can be reduced. Further, the amount of service or help calls from customers to a service or help desk can be reduced in cases in which a given customer environment causes higher CTL wear rates than normal. Still further, the predicted failure points can be used to improve understanding of reliability performance of imaging devices, photoreceptors, and other machines, and to reduce costs associated with imaging devices and support services associated with the imaging devices.

FIG. 1A depicts a cross-section of an imaging member of an exemplary imaging device 100 having a drum configuration according to the present embodiments. It should be appreciated, however, that other configurations are contemplated. As shown in FIG. 1A, the exemplary imaging device 100 comprises a support substrate 102, an electrically conductive ground plane 104, an undercoat layer 106, a charge generation layer 108 and a charge transport layer (CTL) 110. The support substrate 102 can be comprised of a material such as, for example, metal, metal alloy, aluminum, zirconium, niobium, tantalum, vanadium, hafnium, titanium, nickel, stainless steel, chromium, tungsten, molybdenum, and mixtures thereof, and other materials. The charge generation layer 108 and the CTL 110 can form an imaging layer described herein as two separate layers. In embodiments, the charge generation layer 108 can be disposed on top of the CTL 110. It should be appreciated that these two layers can alternatively be combined into a single layer.

Figure 1B:
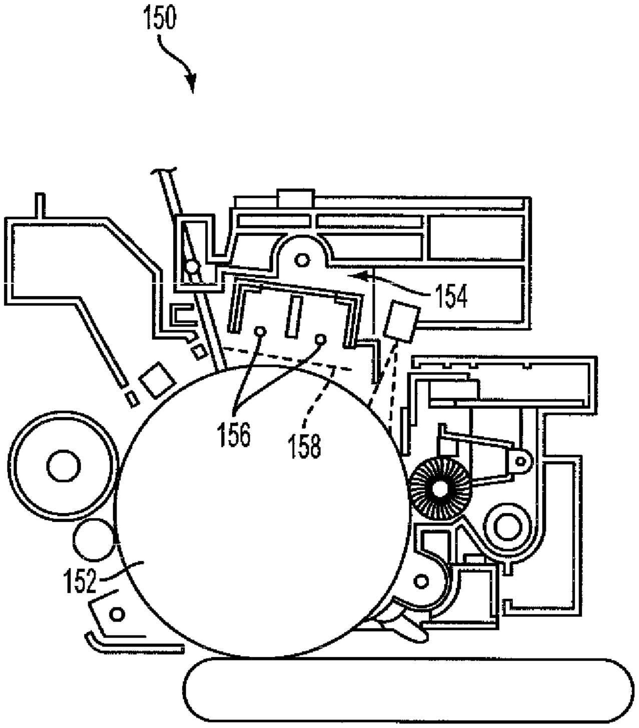
FIG. 1B depicts an exemplary imaging device according to the present teachings.

Referring to FIG. 1B, an exemplary imaging device 150, according to the present embodiments, is depicted. The imaging device 150 can comprise a drum-shaped photoreceptor 152. It should be appreciated that photoreceptors having other shapes are contemplated. A power source 154 can be positioned at a periphery of the photoreceptor 152, according to the present embodiments. The imaging device 150 can further comprise wires 156 and a grid 158. The wires 156 can conduct a current, originating from the power source 154, to generate an electric field in a vicinity of the wires 156. In embodiments, the power source 154 can act to increase or decrease the current to various levels. The grid 158 can facilitate diffusion of a charge pattern through the grid 158 to produce a charge on a surface of the photoreceptor 152. Once charged, the photoreceptor 152 can image a document in the imaging device 150, as conventionally understood. It should be understood that the imaging device 150 can comprise other components and entities to facilitate the functions and operations of the present embodiments such as, for example, regulating the electric field associated with the photoreceptor 152.

Figure 2:
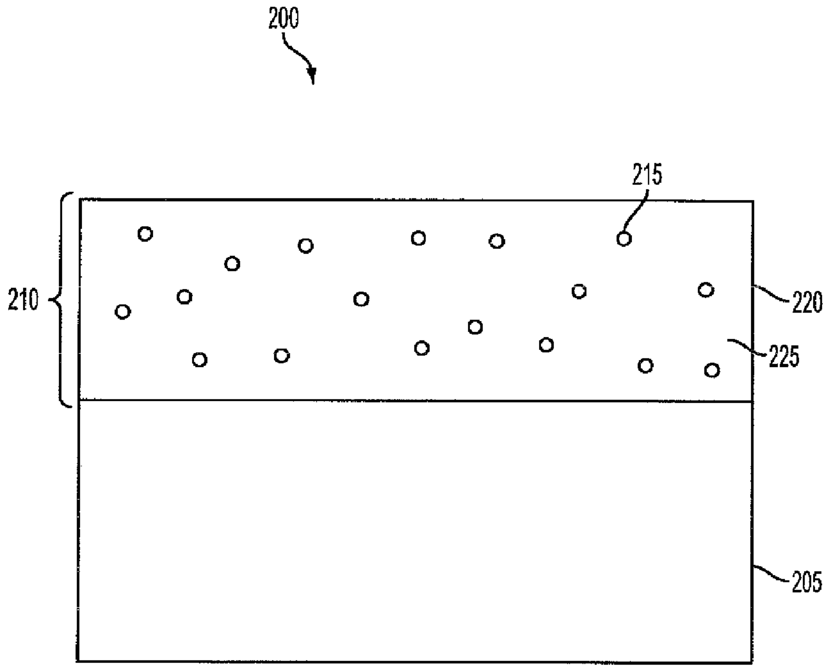
FIG. 2 depicts a cross-section of an exemplary photoreceptor of an imaging device according to the present teachings.

FIG. 2 depicts a detailed cross-section of an exemplary photoreceptor 200 and corresponding CTL according to the present embodiments. The photoreceptor 200 can be drum-shaped as described herein, or can be other shapes or configurations. The photoreceptor 200 can comprise an electroconductive substrate 205 and a photosensitive layer 210. According to embodiments, the photosensitive layer 210 can be a CTL 220 in which a charge generation material 225 and a copolymer 215 can be dispersed. The CTL 220 can comprise a resin having a charge transport ability or a mixture of a low molecular weight charge transport compound and a binder resin. The charge generation material 225 can generate a charge carrier and send the charge carrier to the CTL 220, where the charge carrier can be transported, as conventionally understood. It should be appreciated, though, that the CTL 220 can comprise other materials with a charge transport ability.

Figure 3A:
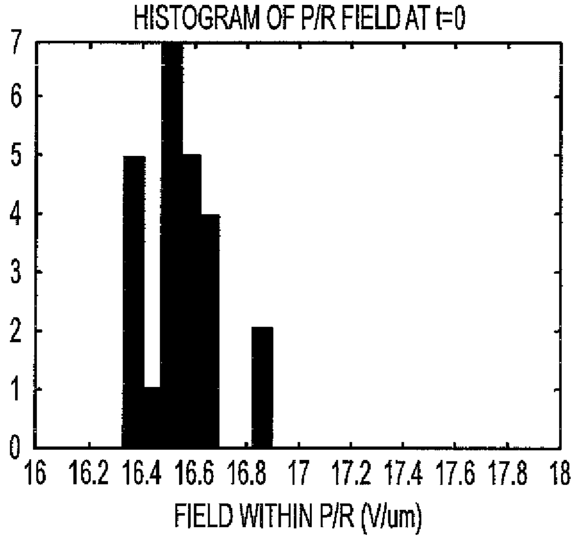
FIG. 3A depicts a histogram showing a distribution of electric field measurements across a length of a photoreceptor within an imaging device according to the present teachings.
Figure 3B:
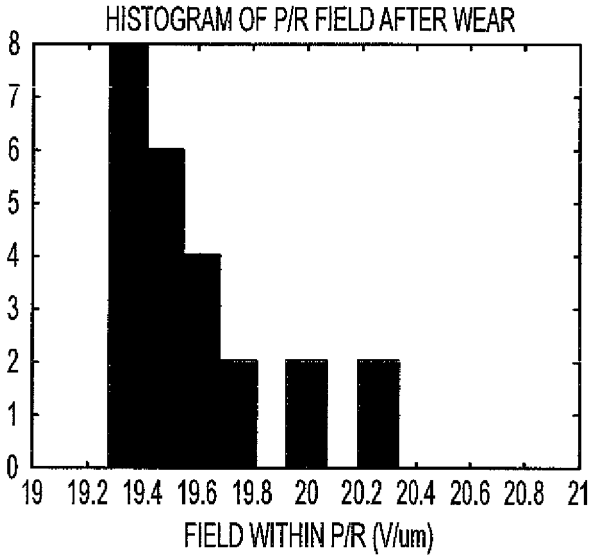
FIG. 3B depicts a histogram showing a distribution of electric field measurements across a length of a photoreceptor within an imaging device according to the present teachings.

Referring to FIGS. 3A and 3B, two histograms show the distribution of electric field measurements across a length of a photoreceptor within an imaging device. FIG. 3A depicts a distribution of electric field measurements across the length of a new photoreceptor in an imaging device, and FIG. 3B depicts the distribution of electric field measurements across the length of the same photoreceptor after the photoreceptor has reached the end of its life. In particular, the photoreceptor of FIG. 3B has a CTL that is too thin in some locations due to the presence of CDS defects. The x-axis of each histogram of FIG. 3A and FIG. 3B corresponds to the electric field, in V/μm, at various locations along the length of the photoreceptor. The y-axis of each graph of FIG. 3A and FIG. 3B corresponds to the number of occurrences or frequency of the electric field at a particular length corresponding to the electric field measurement of the x-axis. For example, in FIG. 3A, there are four (4) locations along the length of the photoreceptor that were measured with a corresponding electric field of 16.6 V/μm.

The mean electric field of FIG. 3A was measured to be 16.5 V/μm with a standard deviation of 0.14 V/μm, and the mean electric field of FIG. 3B was measured to be 19.7 V/μm with a standard deviation of 0.30 V/μm. More particularly, as shown in FIG. 3B, the measured electric fields are elevated due to a reduction in thickness of the CTL. The results shown in FIGS. 3A and 3B, and specifically the standard deviation measurements, indicate a non-uniformity of the wear in the CTL of the photoreceptor. More particularly, the results indicate that the mean wear of the CTL as is conventionally measured is not an accurate gauge of the probability of CDS defects or corresponding failure of the photoreceptor as a result of some locations of the CTL having more wear than other locations. Therefore, measuring the entire length of the CTL for any signs of CDS defects can be used to more accurately determine a predicted failure point of the photoreceptor.

The predicted failure point of the photoreceptor can be more accurately determined by increasing the electric field across the CTL and measuring any resulting CDS defects using a scanner or sensor. In embodiments, the scanner or sensor can be a full width array (FWA) sensor. In embodiments, by applying more charge density to a surface of a drum under a charge device associated with a photoreceptor, the surface voltage of the photoreceptor and the resulting electric field within the CTL can be increased. In embodiments, the increased electric field within the CTL can be similar in magnitude to the electric field amounts as measured in FIG. 3B. In further embodiments, the electric field within the CTL can be increased to a point at which CDS defects in the CTL can occur and the photoreceptor can fail.

According to the present embodiments, the electric field across the CTL can be increased at certain intervals throughout the life of the photoreceptor to increase the voltage on the surface of the photoreceptor. As the electric field is increased, the CDS defects can be detected by a scanner such as a FWA sensor that can monitor the entire image area of the CTL. In embodiments, the CDS defects can be mapped along the entire length and/or circumference of the photoreceptor. If the wear of the CTL is non-uniform, then the image captured by the FWA sensor can show CDS defects at the thinnest areas of the photoreceptor. In embodiments, the electric field increase can be conducted at fixed or varied intervals during the life of the photoconductor or imaging device. In embodiments, a processor of the machine can use the FWA sensor image information to more accurately determine when the photoreceptor can generate CDS defects under normal operating conditions and/or at normal electric fields.

In embodiments, a measurement of an amount of voltage applied at which onset of any CDS defects occur can be of interest. Further, a measurement of a number of CDS defects or a diameter of the CDS defects that can occur at a specific threshold applied voltage can be of interest. It should be appreciated that other measurements can be obtained that can be useful in determining a predicted useable life of a photoreceptor and/or imaging device. Using the measurements, a processor, software application, and/or the like can determine the predicted useful life of the photoreceptor. In embodiments, the information can be reported directly to a customer, to an automated supplies reordering system, or to other individuals or entities. It should be appreciated, however, that other reporting systems are envisioned.

Figure 4:
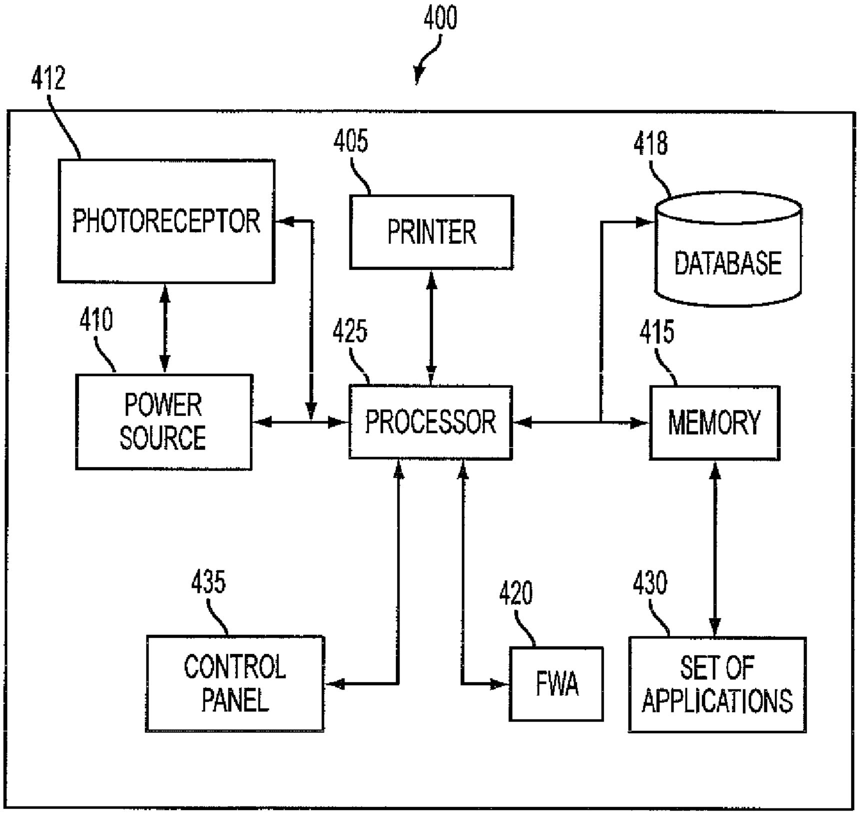
FIG. 4 depicts an exemplary block diagram of an imaging device according to the present teachings.

FIG. 4 depicts an exemplary block diagram of an imaging device 400. The imaging device 400 generally refers to a dual-mode imaging device that can print, copy, fax, scan, and perform similar operations. However, it should be appreciated that the imaging device 400 can be a standalone device capable of handing the functions associated with CDS defect detecting, and usable life predicting, as described herein. Generally, these devices can comprise a network connection, such as, for example, a local area connection (LAN) such as an Ethernet interface, or a modem that can connect to a phone line (not shown in figures).

The imaging device 400 can comprise a printer 405, a power source 410, a memory 415, a photoreceptor 412, and a FWA sensor 420. The printer 405 can print various documents on various substrates. The power source 410 can regulate, modify, measure, and monitor the electric field within a CTL layer of the photoreceptor 412. In embodiments, the power source 410 can increase or decrease a surface voltage of the photoreceptor 412 so that the electric field within the CTL can be increased or decreased. The FWA sensor 420 can detect any CDS defects produced in the CTL of the photoreceptor 412 as a result of a modified electric field, as described herein. In embodiments, the FWA sensor 420 can map any CDS defects along an entire length or circumference of the photoreceptor 412. In embodiments, the FWA sensor 420 and/or the power source 410 can measure the electric field within the CTL of the photoreceptor 412 produced by the increased or decreased surface voltage.

The imaging device 400 can further comprise a processor 425 and a set of applications 430. The set of applications 430 can be initiated by a user, operator, or the like and can be executed on the processor 425 to direct the functions of the imaging device 400 and components thereof, as described herein. In embodiments, the processor 425 can write data to and retrieve data from the memory 415 and/or a database 418. According to the present embodiments, the set of applications 430 in combination with the processor 425 can obtain or retrieve measurement data from the memory 415, power source 410, and/or FWA sensor 420. For example, the processor 425 can retrieve an amount of voltage applied at which onset of any CDS defects occur, as well as any data related to a number or size of CDS defects measured by the FWA sensor 420. The set of applications 430 in combination with the processor 425 can use the retrieved data to determine a predicted useable life of the photoreceptor 412 and/or imaging device 400, according to the present embodiments.

The processor 425 can be coupled to a control panel 435 including, for example, a touchpad or series of buttons which can allow a user a control and a user-readable setup and status screen. In embodiments, a graphical user interface associated with the set of applications 430 can display on the control panel 435. In use, the user can select one or more functions from a number of different functions provided by the imaging device 400 through the use of the control panel 435. For example, the user can select to determine a predicted usable life of the photoreceptor 420 via the control panel 435.

Figure 5:
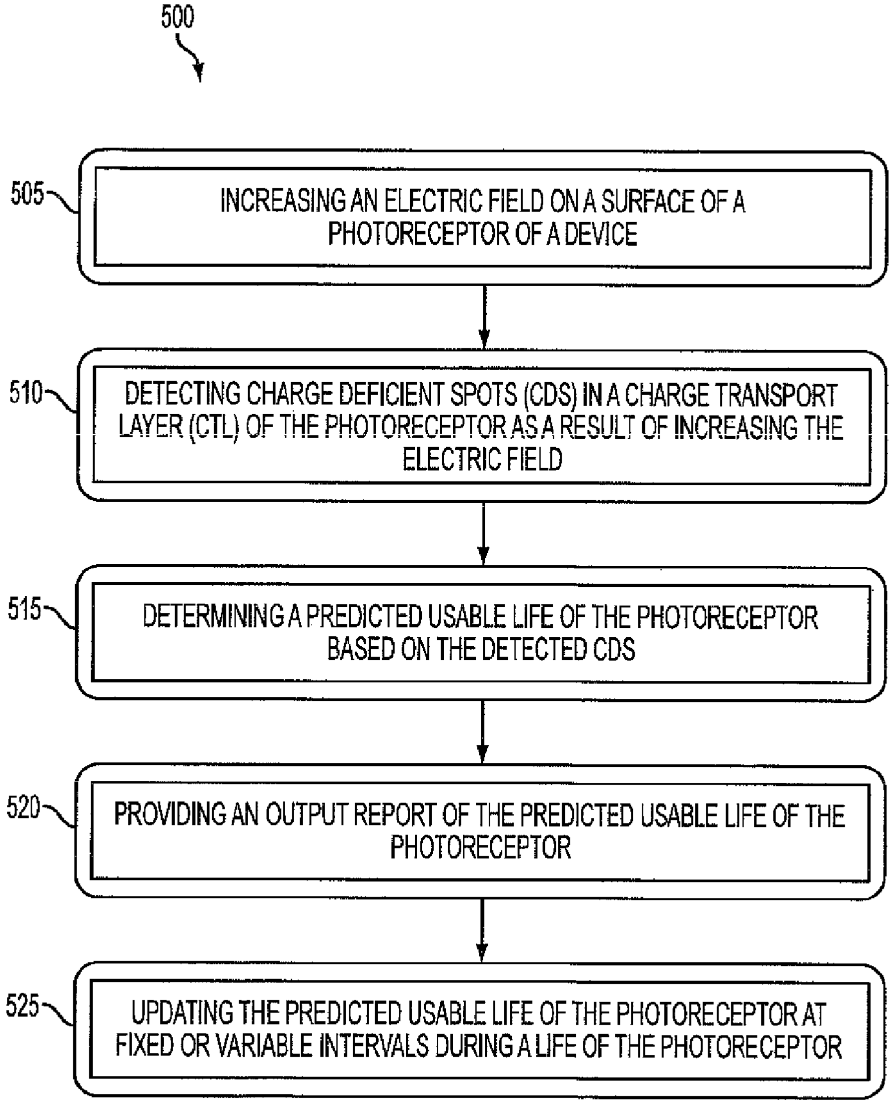
FIG. 5 depicts an exemplary flow diagram of predicting a useable life of a photoreceptor according to the present teachings.

Referring to FIG. 5, a present embodiment for an exemplary method 500 for determining a predicted useable life of a photoreceptor of a device is depicted. It should be appreciated that any combination of the mechanical and electronic components of the imaging device 400 as described with respect to FIG. 4 can perform the steps of the method 500 such as, for example, the processor 425, the photoreceptor 412, the power source 410, the memory 415, the FWA 420, the set of applications 430, and other components.

In 505, an electric field on a surface of the photoreceptor can be increased. In embodiments, the electric field can be increased by applying more charge density to the surface of a photoreceptor drum under a charge device associated with the photoreceptor. In 510, CDS defects in a CTL of the photoreceptor can be detected as a result of the increased electric field. In embodiments, the CDS defects can be detected by a FWA that can map the CDS defects along the entire length or across the circumference of the photoreceptor. In embodiments, if the occurrence of the CDS defects is non-uniform, the image captured by the FWA can show CDS defects at the thinnest area of the photoreceptor.

In 515, a predicted usable life of the photoreceptor can be determined based on the detected CDS defects. In embodiments, a processor or application program can determine an applied voltage at which onset of any CDS defects occurs. Further, the processor or application program can determine the number of CDS defects or a diameter of the CDS defects that occur at a specific applied voltage. The determined voltage and/or CDS defect measurements can be used to determine the predicted usable life of the photoreceptor. In 525, an output report of the predicted usable life of the photoreceptor can be outputted. In embodiments, the output report can be provided to an administrator, owner, or any other user via, for example, a user interface such as a GUI or another interface or reporting mechanism.

In 520, the predicted useable life of the photoreceptor can be updated at fixed or variable intervals during a life of the photoreceptor. In particular, the described functionality of increasing the electric field, detecting the CDS defects, and determining the predicted usable life can be repeated at fixed or variable intervals during the life of the photoreceptor and/or imaging device. Further, a processor or application program associated with the imaging device can update the predicted usable life of the photoreceptor based on the new interval measurements and calculations.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the embodiments have been illustrated with respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the embodiments will be apparent to those skilled in the art from consideration of the specification and practice of the embodiments disclosed herein. It is intended that the specification and examples be considered as exemplary only, with a true scope and spirit of the embodiments being indicated by the following claims.

What is claimed is:

1. A method of determining a predicted useable life of a photoreceptor of a device that performs imaging operations for one or more customers, the method comprising:

increasing, by the device, an electric field across the photoreceptor subsequent to the device performing one or more imaging operations of a customer;

detecting, by the device, charge deficient spots (CDS) in a charge transport layer (CTL) of the photoreceptor as a result of increasing the electric field;

detecting, by the device, a voltage applied to the photoreceptor at which the CDS are detected;

determining the predicted useable life of the photoreceptor based on the detected voltage; and updating the predicted usable life of the photoreceptor at a plurality of intervals during a life of the photoreceptor.

2. The method of claim 1, wherein the charge deficient spots (CDS) are detected using a full width array (FWA).

3. The method of claim 1, wherein increasing the electric field across the photoreceptor comprises increasing a voltage on a surface of the photoreceptor.

4. The method of claim 1, wherein determining the predicted useable life of the photoreceptor based on the detected charge deficient spots (CDS) comprises:

detecting a number of the CDS that appear as a result of increasing the electric field; and determining the predicted useable life of the photoreceptor based on the detected number of CDS.

5. The method of claim 1, wherein the charge deficient spots (CDS) are detected across a length and circumference of the photoreceptor.

6. The method of claim 1, further comprising providing an output report of the predicted usable life of the photoreceptor.

7. The method of claim 6, wherein the output report is provided via a graphical user interface (GUI).

8. The method of claim 1, wherein the output report is provided to at least one of the customer or a supplies ordering system.

9. A system for determining a predicted useable life of a photoreceptor of a device that performs imaging operations for one or more customers, the system comprising:

a power source configured to increase, by the device, an electric field across the photoreceptor subsequent to the device performing one or more imaging operations of a customer;

a scanner configured to detect, by the device, charge deficient spots (CDS) in a charge transport layer (CTL) of the photoreceptor as a result of increasing the electric field; and a processor configured to detect, by the device, a voltage applied to the photoreceptor at which the CDS are detected, determine the predicted useable life of the photoreceptor based on the detected voltage, and update the predicted usable life of the photoreceptor at a plurality of intervals during a life of the photoreceptor.

10. The system of claim 9, wherein the scanner is a full width array (FWA).

11. The system of claim 9, wherein the electric field across the photoreceptor is increased by increasing a voltage on a surface of the photoreceptor.

12. The system of claim 9, wherein the processor determines the predicted useable life of the photoreceptor by:

detecting a number of the CDS that appear as a result of increasing the electric field; and determining the predicted useable life of the photoreceptor based on the detected number of CDS.

13. The system of claim 9, wherein the charge deficient spots (CDS) are detected across a length and circumference of the photoreceptor.

14. The system of claim 9, wherein the processor is further configured to provide an output report of the predicted usable life of the photoreceptor.

15. The system of claim 14, wherein the output report is provided via a graphical user interface (GUI).

16. The system of claim 14, wherein the output report is provided to at least one of the customer or a supplies ordering system.

* * * * *